(12) United States Patent
Okada et al.

(10) Patent No.: US 10,307,825 B2
(45) Date of Patent: Jun. 4, 2019

(54) METAL POWDER, INK, SINTERED BODY, SUBSTRATE FOR PRINTED CIRCUIT BOARD, AND METHOD FOR MANUFACTURING METAL POWDER

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Issei Okada, Osaka (JP); Yoshio Oka, Osaka (JP); Takashi Kasuga, Osaka (JP); Yasuhiro Okuda, Osaka (JP); Jinjoo Park, Koka (JP); Kousuke Miura, Koka (JP); Hiroshi Ueda, Koka (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 15/546,093

(22) PCT Filed: Jan. 26, 2016

(86) PCT No.: PCT/JP2016/052159
§ 371 (c)(1),
(2) Date: Jul. 25, 2017

(87) PCT Pub. No.: WO2016/121749
PCT Pub. Date: Aug. 4, 2016

(65) Prior Publication Data
US 2018/0015547 A1   Jan. 18, 2018

(30) Foreign Application Priority Data

Jan. 30, 2015   (JP) ................................. 2015-017854

(51) Int. Cl.
*B22F 9/24* (2006.01)
*B05D 3/02* (2006.01)
(Continued)

(52) U.S. Cl.
CPC .............. *B22F 9/24* (2013.01); *B05D 3/0254* (2013.01); *B22F 1/00* (2013.01); *B22F 7/04* (2013.01);
(Continued)

(58) Field of Classification Search
CPC ...... B05D 3/0254; B22F 1/00; B22F 2301/10; B22F 2304/05; B22F 7/04; B22F 9/24;
(Continued)

(56) References Cited

U.S. PATENT DOCUMENTS 6,045,925 A    4/2000  Klabunde et al.
6,183,545 B1 * 2/2001  Okuhama ............. C22B 3/0051
                                                106/1.18

FOREIGN PATENT DOCUMENTS

JP    2010-192841 A    9/2010
JP    2010-275578 A   12/2010
(Continued)

OTHER PUBLICATIONS

"Practical Inorganic Chemical Engineering Technics", edited by FU Dexue, Jul. 1, 1999, pp. 65-71, especially p. 67.
(Continued)

*Primary Examiner* — Jenny R Wu
(74) *Attorney, Agent, or Firm* — Drinker Biddle & Reath LLP

(57) ABSTRACT

An object of the present invention is to provide a metal powder and an ink with which a sintered body having good flexibility can be formed, and a sintered body having good flexibility. A metal powder according to an embodiment of the present invention has a mean particle size $D_{50BET}$ of 1
(Continued)

nm or more and 200 nm or less as calculated by a BET method, a mean crystallite size $D_{Cryst}$ of 20 nm or less as determined by an X-ray analysis, and a ratio ($D_{Cryst}/D_{50BET}$) of the mean crystallite size $D_{Cryst}$ to the mean particle size $D_{50BET}$ of less than 0.4.

6 Claims, 3 Drawing Sheets

(51) Int. Cl.
| | |
|---|---|
| H05K 1/09 | (2006.01) |
| B22F 1/00 | (2006.01) |
| B22F 7/04 | (2006.01) |
| H01B 1/00 | (2006.01) |
| H01B 1/22 | (2006.01) |
| H01B 5/00 | (2006.01) |
| H01B 5/14 | (2006.01) |
| H01B 13/00 | (2006.01) |
| C22C 9/00 | (2006.01) |

(52) U.S. Cl.
CPC ............... *H01B 1/00* (2013.01); *H01B 1/22* (2013.01); *H01B 5/00* (2013.01); *H01B 5/14* (2013.01); *H01B 13/00* (2013.01); *H05K 1/092* (2013.01); *B22F 2301/10* (2013.01); *B22F 2304/05* (2013.01); *C22C 9/00* (2013.01)

(58) Field of Classification Search
CPC .. C22C 9/00; H01B 13/00; H01B 1/00; H01B 1/22; H01B 5/00; H01B 5/14; H05K 1/092
See application file for complete search history.

(56) References Cited

FOREIGN PATENT DOCUMENTS

| | | | |
|---|---|---|---|
| JP | 2013-28859 A | | 2/2013 |
| JP | 2013028859 A | * | 2/2013 |
| JP | 2015-168878 A | | 9/2015 |

OTHER PUBLICATIONS

The Notification of the Second Office Action issued to the counterpart Chinese Patent Application No. 201680007871.3 dated Jan. 14, 2019 (along with its English-language translation).

* cited by examiner

METAL POWDER, INK, SINTERED BODY, SUBSTRATE FOR PRINTED CIRCUIT BOARD, AND METHOD FOR MANUFACTURING METAL POWDER

TECHNICAL FIELD

The present invention relates to a metal powder, an ink, a sintered body, a substrate for a printed circuit board, and a method for manufacturing a metal powder.

BACKGROUND ART

A known technique used for manufacturing a printed circuit board or the like is a technique in which a conductive film formed of a metal sintered body is formed on a surface of a substrate such as a resin film by application and firing of an ink containing a metal powder.

It has been proposed that, in order to improve adhesion of such a metal sintered body to a resin film, a crystallite size of a metal powder dispersed in an ink is set to a particular value or more, and a porosity of a sintered body layer is set to 1% or less (refer to Japanese Unexamined Patent Application Publication No. 2010-192841).

CITATION LIST

Patent Literature

PTL 1: Japanese Unexamined Patent Application Publication No. 2010-192841

SUMMARY OF INVENTION

Technical Problem

However, metal sintered bodies having a low porosity as described in the above patent application publication are easily broken because a stress is concentrated on portions adjacent to a small number of pores, and thus do not have sufficient flexibility. For example, when a conductive pattern is formed on a polyimide film by application and firing of an ink containing a metal powder dispersed therein to manufacture a flexible printed circuit board, the resulting metal sintered body may have insufficient flexibility, and bending of the flexible printed circuit board may cause a risk of disconnection of the conductive pattern.

The present invention has been made under the circumstances described above. An object of the present invention is to provide a metal powder and an ink with which a sintered body having good flexibility can be formed, a substrate for a printed circuit board and a sintered body which have good flexibility, and a method for manufacturing a metal powder with which a sintered body having good flexibility can be formed.

Solution to Problem

A metal powder according to an embodiment of the present invention, which has been made to solve the problem described above, has a mean particle size $D_{50BET}$ of 1 nm or more and 200 nm or less as calculated by a BET method, a mean crystallite size $D_{Cryst}$ of 20 nm or less as determined by an X-ray analysis, and a ratio ($D_{Cryst}/D_{50BET}$) of the mean crystallite size $D_{Cryst}$ to the mean particle size $D_{50BET}$ of less than 0.4.

A method for manufacturing a metal powder according to another embodiment of the present invention, which has been made to solve the problem described above, is a method for manufacturing a metal powder having a mean particle size $D_{50BET}$ of 1 nm or more and 200 nm or less as calculated by a BET method, a mean crystallite size $D_{Cryst}$ of 20 nm or less as determined by an X-ray analysis, and a ratio ($D_{Cryst}/D_{50BET}$) of the mean crystallite size $D_{Cryst}$ to the mean particle size $D_{50BET}$ of less than 0.4, the method including a step of reducing a metal ion with a reducing agent in an aqueous solution, in which the reduction step is conducted at 100° C. or lower.

Advantageous Effects of Invention

The metal powder according to an embodiment of the present invention and the metal powder manufactured by the method for manufacturing a metal powder according to another embodiment of the present invention can provide a sintered body having good flexibility.

DESCRIPTION OF EMBODIMENTS

Figure 1:
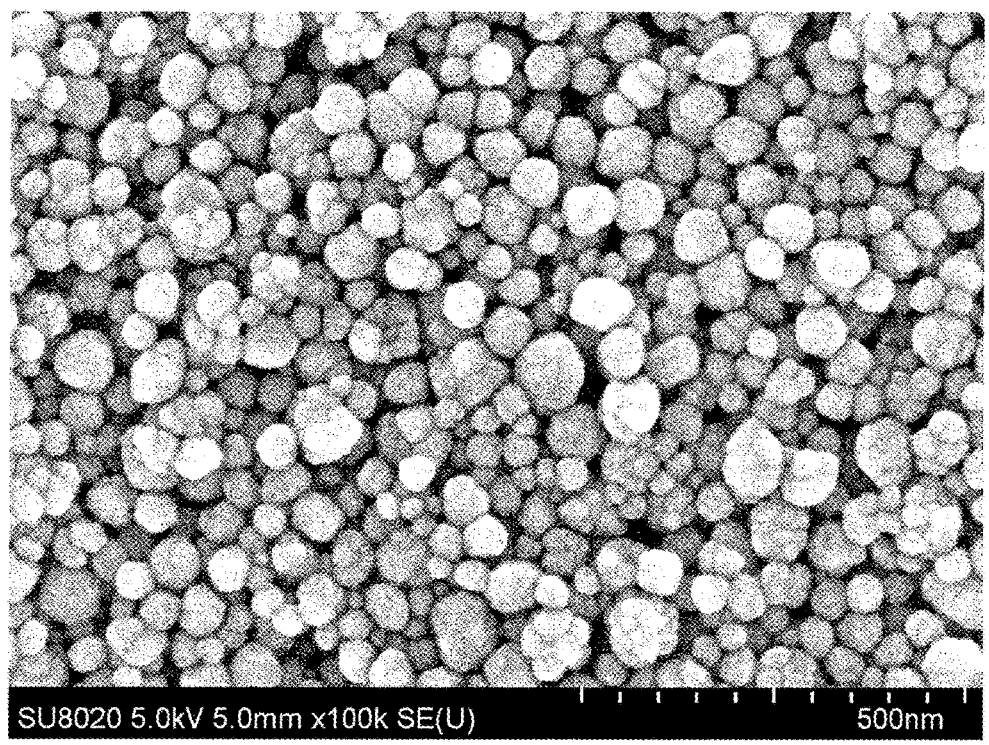
FIG. 1 is an electron micrograph of a metal powder according to an embodiment of the present invention.

Description of Embodiments of the Present Invention

A metal powder according to an embodiment of the present invention has a mean particle size $D_{50BET}$ of 1 nm or more and 200 nm or less as calculated by a BET method, a mean crystallite size $D_{Cryst}$ of 20 nm or less as determined by an X-ray analysis, and a ratio ($D_{Cryst}/D_{50BET}$) of the mean crystallite size $D_{Cryst}$ to the mean particle size $D_{50BET}$ of less than 0.4.

Since the mean particle size $D_{50BET}$ of the metal powder is within the above range, a dense sintered body can be formed by sintering. Since the mean crystallite size $D_{Cryst}$ of the metal powder is equal to or less than the above upper limit, and the ratio ($D_{Cryst}/D_{50BET}$) of the mean crystallite size $D_{Cryst}$ to the mean particle size $D_{50BET}$ of the metal powder is less than the above upper limit, a sintered body formed by using the metal powder also has small crystallites. Accordingly, when a stress is applied to the sintered body of the metal powder, fine cracks are formed between the crystallites to relieve the stress, and thus the sintered body exhibits good flexibility.

The metal powder preferably contains copper or a copper alloy as a main component. When the main component is copper or a copper alloy, a sintered body having good conductivity can be formed.

The metal powder preferably contains a metal different from a main component. Incorporation of a metal different from a main component in the metal powder suppresses growth of crystallites of the main metal serving as the main component during formation and firing of the metal powder.

The metal powder is preferably formed by a liquid-phase reduction method of reducing a metal ion with a reducing agent in an aqueous solution. When the metal powder is formed by a liquid-phase reduction method of reducing a metal ion with a reducing agent in an aqueous solution, the metal powder can have a fine particle size and a shape close to a sphere, and the ratio of the mean crystallite size $D_{Cryst}$ to the mean particle size $D_{50BET}$ can be easily made low.

The reducing agent used in the liquid-phase reduction method is preferably a trivalent titanium ion. When the reducing agent used in the liquid-phase reduction method is a trivalent titanium ion, the metal powder can have a uniform particle size and a uniform particle shape.

An ink according to an embodiment of the present invention contains the above metal powder and a dispersion medium for the metal powder.

Since the ink contains, as a dispersoid, the metal powder with which a sintered body having good flexibility can be formed, a sintered body having good flexibility can be formed by application and firing.

A sintered body according to an embodiment of the present invention is formed by application and firing of the above ink and has a mean crystallite size $D_{Cryst}$ of 25 nm or less.

Since the sintered body is formed by using the ink and has a mean crystallite size $D_{Cryst}$ of the upper limit or less, a stress can be relieved by formation of fine cracks. Thus, the sintered body exhibits good flexibility.

A substrate for a printed circuit board according to an embodiment of the present invention includes a base film having an insulating property, and the above sintered body that is film-like and stacked on at least one side of the base film.

Since the substrate for a printed circuit board includes the sintered body that is film-like and stacked on at least one side of a base film, it is possible to manufacture a printed circuit board in which the sintered body is unlikely to be broken by bending and which exhibits good flexibility.

A method for manufacturing a metal powder according to an embodiment of the present invention is a method for manufacturing a metal powder having a mean particle size $D_{50BET}$ of 1 nm or more and 200 nm or less as calculated by a BET method, a mean crystallite size $D_{Cryst}$ of 20 nm or less as determined by an X-ray analysis, and a ratio ($D_{Cryst}/D_{50BET}$) of the mean crystallite size $D_{Cryst}$ to the mean particle size $D_{50BET}$ of less than 0.4, the method including a step of reducing a metal ion with a reducing agent in an aqueous solution, in which the reduction step is conducted at 100° C. or lower.

Since the method for manufacturing a metal powder includes a step of reducing a metal ion with a reducing agent in an aqueous solution and the reduction step is conducted at 100° C. or lower, growth of crystallites is suppressed to easily obtain a small crystallite size. Accordingly, it is possible to easily manufacture a metal powder with which a sintered body having good flexibility can be formed.

Herein, the term "mean particle size $D_{50BET}$" refers to a value [nm] calculated by formula (1) below:

$$D_{50BET}[nm]=6\times10^3/(A[m^2/g]\times\rho[g/cm^3])  \quad (1)$$

where A [m²/g] represents a BET specific surface area measured by using nitrogen gas, and ρ [g/cm³] represents a density of a bulk metal.

The term "mean crystallite size $D_{Cryst}$" refers to a value measured in accordance with JIS-H7805 (2005). The term "main component" refers to a component whose mass content is the highest, and preferably a component contained in an amount of 90% by mass or more.

Detailed Description of Embodiments of the Present Invention

A metal powder according to an embodiment of the present invention will be described in detail below.

A metal powder according to an embodiment of the present invention shown as an example in FIG. 1 is used for forming a sintered body having conductivity by application and firing of an ink prepared by dispersing the metal powder in a dispersion medium.

The lower limit of the mean particle size $D_{50BET}$ of the metal powder calculated by the BET method is 1 nm, and preferably 20 nm. The upper limit of the mean particle size $D_{50BET}$ of the metal powder is 200 nm, preferably 150 nm, and more preferably 100 nm. When the mean particle size $D_{50BET}$ of the metal powder is less than the lower limit, the metal powder in the ink may have degraded dispersibility and stability. When the mean particle size $D_{50BET}$ of the metal powder is more than the upper limit, the metal powder may tend to settle, and in the applied ink, the density of the metal powder may be unlikely to be uniform.

The lower limit of the mean crystallite size $D_{Cryst}$ of the metal powder determined by an X-ray analysis is preferably 0.1 nm, and more preferably 1 nm. On the other hand, the upper limit of the mean crystallite size $D_{Cryst}$ of the metal powder is 20 nm, preferably 18 nm, and more preferably 10 nm. When the mean crystallite size $D_{Cryst}$ of the metal powder is less than the lower limit, it may become difficult to manufacture the metal powder. On the other hand, when the mean crystallite size $D_{Cryst}$ of the metal powder is more than the upper limit, a sintered body formed by firing the metal powder may exhibit insufficient flexibility.

Although the detailed mechanism is unclear, it is believed that a small mean crystallite size $D_{Cryst}$ improves flexibility of a sintered body because, when a bending stress is applied to a sintered body formed by firing the metal powder, fine cracks are formed between the crystallites to relieve the bending stress.

The lower limit of a ratio ($D_{Cryst}/D_{50BET}$) of the mean crystallite size $D_{Cryst}$ to the mean particle size $D_{50BET}$ of the metal powder is preferably 0.05, and more preferably 0.1. The upper limit of the ratio of the mean crystallite size $D_{Cryst}$ to the mean particle size $D_{50BET}$ of the metal powder is less than 0.4, and more preferably less than 0.3. When the ratio of the mean crystallite size $D_{Cryst}$ to the mean particle size $D_{50BET}$ of the metal powder is less than the lower limit, it may become difficult to manufacture the metal powder. On the other hand, when the ratio of the mean crystallite size $D_{Cryst}$ to the mean particle size $D_{50BET}$ of the metal powder is equal to or more than the upper limit, a sintered body formed by firing the metal powder may have insufficient flexibility and fatigue strength.

Unlike particle sizes measured by many other methods, such as a volume equivalent size, the mean particle size $D_{50BET}$ has a tendency that the measured value thereof decreases with a decrease in the particle size of primary particles. On the other hand, when the primary particles have a large size, the $D_{Cryst}$ also tends to increase. However, in such a case, since the shrinking before and after sintering is small, probably, a dense sintered body having fewer pores is formed and tends to be broken during bending. The presence of an appropriate number of pores (1% or more) in a sintered body enables the formation of fine cracks that do not cause the entire breakage, and thus flexibility and fatigue strength of the sintered body improve. Accordingly, since the metal powder has a low ratio ($D_{Cryst}/D_{50BET}$) of the mean crystallite size $D_{Cryst}$ to the mean particle size $D_{50BET}$, the metal powder has a large number of crystal grains in primary particles and a small mean crystallite size $D_{Cryst}$. This structure enables the formation of a sintered body resistant to bending.

Various metals can be used as the main component of the metal powder. Copper and copper alloys, which are relatively inexpensive and have good conductivity, are preferable.

The metal powder preferably contains a trace amount of an auxiliary metal (different type of metal) besides a main metal serving as the main component. The incorporation of a trace amount of an auxiliary metal suppresses the growth of crystallites of the main metal during the formation and firing of the metal powder.

When the metal powder is formed by, for example, a liquid-phase reduction method, which will be described later, the auxiliary metal is preferably a metal that can be precipitated at the same time with precipitation of the main metal. When the main metal is copper, examples of the auxiliary metal include titanium, silver, nickel, and zinc. In particular, when the auxiliary metal is titanium, the auxiliary metal is easily taken in particles during the time from the generation of a core of the main metal to the growth of the particles because the auxiliary metal is a metal species contained in a reducing agent. Accordingly, since the auxiliary metal can be relatively easily contained in the metal powder, the growth of crystallites of the main metal can be suppressed more reliably during sintering of the metal powder.

The lower limit of the content of the auxiliary metal relative to the main metal in the metal powder is preferably 0.02% by mass, and more preferably 0.05% by mass. The upper limit of the content of the auxiliary metal relative to the main metal in the metal powder is preferably 5% by mass, and more preferably 1% by mass. When the content of the auxiliary metal relative to the main metal in the metal powder is less than the lower limit, it may not be possible to sufficiently suppress the growth of crystallites of the main metal during sintering. On the other hand, when the content of the auxiliary metal relative to the main metal in the metal powder is more than the upper limit, it may become difficult to generate a homogeneous metal powder.

[Method for Manufacturing Metal Powder]

Subsequently, a method for manufacturing the metal powder will be described in detail. The metal powder can be manufactured by, for example, a high-temperature treatment method, a liquid-phase reduction method, or a gas-phase method.

In particular, the metal powder is preferably manufactured by a liquid-phase reduction method in which a metal powder is precipitated by reducing metal ions with a reducing agent in an aqueous solution. The use of the liquid-phase reduction method enables the metal powder to have a fine particle size and a shape close to a sphere, and enables the ratio of the mean crystallite size $D_{Cryst}$ to the mean particle size $D_{50BET}$ to be relatively easily low.

An example of a specific method for manufacturing the metal powder by the liquid-phase reduction method is a method including a reduction step of subjecting metal ions to a reduction reaction with a reducing agent for a certain period of time in a solution prepared by dissolving, in water, a dispersing agent and a water-soluble metal compound serving as the source of ions of the metal that is to form the metal powder.

Examples of the water-soluble metal compound serving as the source of metal ions include, in the case of copper, copper(II) nitrate trihydrate ($Cu(NO_3)_2 \cdot 3H_2O$) and copper (II) sulfate pentahydrate ($CuSO_4 \cdot 5H_2O$); in the case of silver, silver(I) nitrate ($AgNO_3$) and silver methanesulfonate ($CH_3SO_3Ag$); in the case of gold, tetrachloroauric(III) acid tetrahydrate ($HAuCl_4 \cdot 4H_2O$); and, in the case of nickel, nickel(II) chloride hexahydrate ($NiCl_2 \cdot 6H_2O$) and nickel(II) nitrate hexahydrate ($Ni(NO_3)_2 \cdot 6H_2O$). Also for other metal powders, water-soluble compounds such as chlorides, nitrate compounds, and sulfate compounds can be used.

When the liquid-phase reduction method is employed to manufacture a metal powder, various reducing agents that can reduce and precipitate metal ions in a liquid-phase (aqueous solution) reaction systems can be used. Examples of the reducing agents include sodium borohydride, sodium hypophosphite, hydrazine, transition metal ions such as trivalent titanium ions and divalent cobalt ions, ascorbic acid, reducing sugars such as glucose and fructose, and polyhydric alcohols such as ethylene glycol and glycerin.

A method in which a metal powder is precipitated by reducing metal ions by a redox action during oxidation of trivalent titanium ions among the above reducing agents into tetravalent ions, that is, a liquid-phase reduction method (also referred to as titanium redox process) in which trivalent titanium ions are used as a reducing agent is employed. A metal powder obtained by the titanium redox process have a small and uniform particle size, and further have a shape close to a spherical shape. That is, the titanium redox process provides a metal powder having a mean particle size $D_{50BET}$ close to a size measured by a method for measuring, for example, a volume equivalent sizer. Therefore, with the titanium redox process, the ratio of the mean crystallite size $D_{Cryst}$ to the mean particle size $D_{50BET}$ can be made low relatively easily.

The particle size of the metal powder can be controlled by adjusting the types and mixing proportions of the metal compound, the dispersing agent, and the reducing agent, and by adjusting, for example, the stirring rate, the temperature, the time, and the pH in the reduction step of subjecting the metal compound to a reduction reaction.

The lower limit of the temperature in the reduction step is preferably 0° C., and more preferably 15° C. The upper limit of the temperature in the reduction step is 100° C., preferably 60° C., and more preferably 50° C. When the temperature in the reduction step is less than the lower limit, the reduction reaction efficiency may become insufficient. On the other hand, when the temperature in the reduction step is more than the upper limit, crystallites grow and sintered bodies of the metal powder may have insufficient flexibility.

The pH of the reaction system in the reduction step is preferably adjusted to 7 or more and 13 or less in order to obtain a metal powder having a very small particle size for this embodiment. At this time, a pH adjuster may be used to adjust the pH of the reaction system to be in this range. This pH adjuster may be a common acid or alkali such as hydrochloric acid, sulfuric acid, sodium hydroxide, or sodium carbonate. Sodium carbonate, which functions as a buffer capable of finely adjusting the pH, is preferable.

The metal powder formed by the liquid-phase reduction method is preferably washed after separation from the aqueous solution and then used.

Examples of a solid-liquid separation method for separating the metal powder formed from the aqueous solution include filtration and centrifugal separation. Of these, centrifugal separation is preferable. Centrifugal separation has a higher dehydration efficiency of solids than filtration using an ultrafiltration membrane, and thus washing can be efficiently performed with a small amount of water.

The washing of the metal powder after centrifugal separation is preferably performed by adding pure water to the separated metal powder, stirring the resulting mixture, and further performing centrifugal separation of the mixture. Preferably, this washing is repeatedly performed a plurality of times. The lower limit of the amount of pure water used each time of this washing is preferably 1% by mass, and more preferably 3% by mass relative to the amount of pure water in the aqueous solution for liquid-phase reduction. The upper limit of the amount of pure water used each time of this washing is preferably 20% by mass, and more preferably 15% by mass relative to the amount of pure water in the aqueous solution for liquid-phase reduction. When the amount of pure water used each time of the washing is less than the lower limit, impurities may be insufficiently removed, and it may become necessary to increase the number of times of washing. On the other hand, when the amount of pure water used each time of the washing is more than the upper limit, metal particles are aggregated by a solvent shock at the time of the addition of pure water, which may impair dispersibility of the metal powder.

The number of times of the washing is preferably once to three times. When the number of the washing is less than the lower limit, the metal powder may have insufficient dispersibility due to residual impurities. On the other hand, when the number of the washing is more than the upper limit, the dispersing agent adhering to the peripheries of metal particles, the dispersing agent being derived from the aqueous solution for liquid-phase reduction, is excessively removed, and the metal particles thereby easily aggregate, which may impair dispersibility of the metal powder.

[Advantages]

Since the metal powder has a mean particle size $D_{50BET}$ within the above range, a dense sintered body can be formed by sintering. Furthermore, since the mean crystallite size $D_{Cryst}$ of the metal powder is equal to or less than the upper limit and the ratio ($D_{Cryst}/D_{50BET}$) of the mean crystallite size $D_{Cryst}$ to the mean particle size $D_{50BET}$ of the metal powder is less than the upper limit, a sintered body formed by using the metal powder has small crystallites. Accordingly, when a stress is applied to a sintered body of the metal powder, fine cracks are formed between the crystallites to thereby relieve the stress. Therefore, the sintered body exhibits good flexibility.

[Ink]

Furthermore, an ink according to an embodiment of the present invention will be described in detail. The ink contains the metal powder and a dispersion medium for the metal powder. That is, the ink contains the above-described metal powder as a dispersoid. The ink may contain additives such as a dispersing agent.

<Dispersion Medium>

As the dispersion medium of the ink, mixtures of water and at least one highly polar solvent are used. Among these, mixtures of water and a highly polar solvent compatible with water are suitably used. A liquid prepared from an aqueous reducing agent solution obtained after precipitation of a metal powder may be used as the dispersion medium of the ink. Specifically, an aqueous reducing agent solution containing a metal powder may be subjected to a treatment such as ultrafiltration, centrifugal separation, or electrodialysis in advance to remove impurities, and a highly polar solvent may be added to the resulting liquid. Thus, a dispersion medium that preliminarily contains a certain amount of a metal powder is obtained.

The highly polar solvent in the dispersion medium is preferably a volatile organic solvent that can vaporize within a short time during firing. When a volatile organic solvent is used as the highly polar solvent, the highly polar solvent volatilizes within a short time during firing to rapidly increase the viscosity of the ink applied to a surface of a substrate without causing a movement of the metal powder.

Any organic solvent having volatility at room temperature (5° C. or higher and 35° C. or lower) can be used as the volatile organic solvent. Among such organic solvents, volatile organic solvents having a boiling point of, for example, 60° C. or higher and 140° C. or lower at atmospheric pressure are preferable. In particular, aliphatic saturated alcohols having 1 to 5 carbon atoms, the aliphatic saturated alcohols having high volatility and good compatibility with water, are preferable. Examples of the aliphatic saturated alcohols having 1 to 5 carbon atoms include methyl alcohol, ethyl alcohol, n-propyl alcohol, isopropyl alcohol, n-butyl alcohol, isobutyl alcohol, sec-butyl alcohol, tert-butyl alcohol, n-amyl alcohol, and isoamyl alcohol. One of these or a mixture of two or more thereof may be used.

The lower limit of the content of the volatile organic solvent in the total dispersion medium is preferably 30% by mass, and more preferably 40% by mass. The upper limit of the content of the volatile organic solvent in the total dispersion medium is preferably 80% by mass, and more preferably 70% by mass. When the content of the volatile organic solvent in the total dispersion medium is less than the lower limit, it may not be possible to increase the viscosity of the ink within a short time during firing. When the content of the volatile organic solvent in the total dispersion medium is more than the upper limit, the water content is relatively decreased, and thus wettability of the ink to the surface of a substrate made of, for example, a glass, ceramic, or plastic may become insufficient.

Examples of the highly polar solvents other than the volatile organic solvents include ethylene glycol, propylene glycol, and glycerin. One of these or a mixture of two or more thereof may be used. These highly polar solvents function as a binder that prevents a metal powder from moving during firing.

The lower limit of the content of the total dispersion medium in the ink is preferably 100 parts by mass, and more preferably 400 parts by mass relative to 100 parts by mass of the metal powder. The upper limit of the content of the total dispersion medium in the ink is preferably 3,000 parts by mass, and more preferably 1,000 parts by mass relative to 100 parts by mass of the metal powder. When the content of the total dispersion medium in the ink is less than the lower limit, the ink has a high viscosity, which may result in difficulty in application. When the content of the total dispersion medium in the ink is more than the upper limit, the ink has a low viscosity, and it may not be possible to form a coating film having a sufficient thickness during application.

[Advantages]

Since the ink contains the above-described metal powder as a dispersoid, a sintered body having good flexibility can be formed by application and firing.

[Sintered Body]

Furthermore, a sintered body according to an embodiment of the present invention will be described in detail. The sintered body is formed by application and firing of the ink.

The lower limit of the mean crystallite size $D_{Cryst}$ of the sintered body is preferably 0.1 nm, and more preferably 1 nm. The upper limit of the mean crystallite size $D_{Cryst}$ of the sintered body is preferably 25 nm, and more preferably 20 nm. When the mean crystallite size $D_{Cryst}$ of the sintered body is less than the lower limit, the metal powder used in the ink may not be easily manufactured. On the other hand, when the mean crystallite size $D_{Cryst}$ of the sintered body is more than the upper limit, the sintered body may exhibit insufficient flexibility.

[Method for Manufacturing Sintered Body]

The sintered body is manufactured by applying the above-described ink to a surface of a substrate, drying the ink, and then firing the ink. In a firing step, the dispersing agent and other organic substances contained in the applied ink are removed through volatilization and decomposition. As a result, the metal powder is left in a sintered state or at a pre-sintered stage in which metal particles are in close contact with each other to be bonded in a solid state.

The lower limit of the firing temperature is preferably 150° C., and more preferably 200° C. The upper limit of the firing temperature is preferably 500° C., and more preferably 400° C. When the firing temperature is less than the lower limit, bonding between the metal particles may become insufficient. On the other hand, when the firing temperature is more than the upper limit, crystallites grow and the sintered body may have insufficient flexibility, or a substrate may deform when the substrate is made of an organic resin such as polyimide.

The firing step is preferably performed in an atmosphere in which a certain amount of oxygen is contained. The lower limit of the oxygen concentration of the atmosphere during firing is preferably 1 ppm by volume, and more preferably 10 ppm by volume. The upper limit of the oxygen concentration is preferably 10,000 ppm by volume, and more preferably 1,000 ppm by volume. When the oxygen concentration is less than the lower limit, the amount of metal oxide generated near an interface between the substrate and the sintered body decreases, and adhesion strength between the substrate and the sintered body, the adhesion strength being exhibited by the metal oxide, may become insufficient. On the other hand, when the oxygen concentration is more than the upper limit, the metal powder may be excessively oxidized, and the sintered body may have insufficient conductivity and fatigue strength.

[Advantages]

Since the sintered body has a mean crystallite size $D_{Cryst}$ of equal to or lower than the upper limit, fine cracks are formed to relieve a stress. Thus, the sintered body exhibits good flexibility.

[Substrate for Printed Circuit Board]

Figure 2:
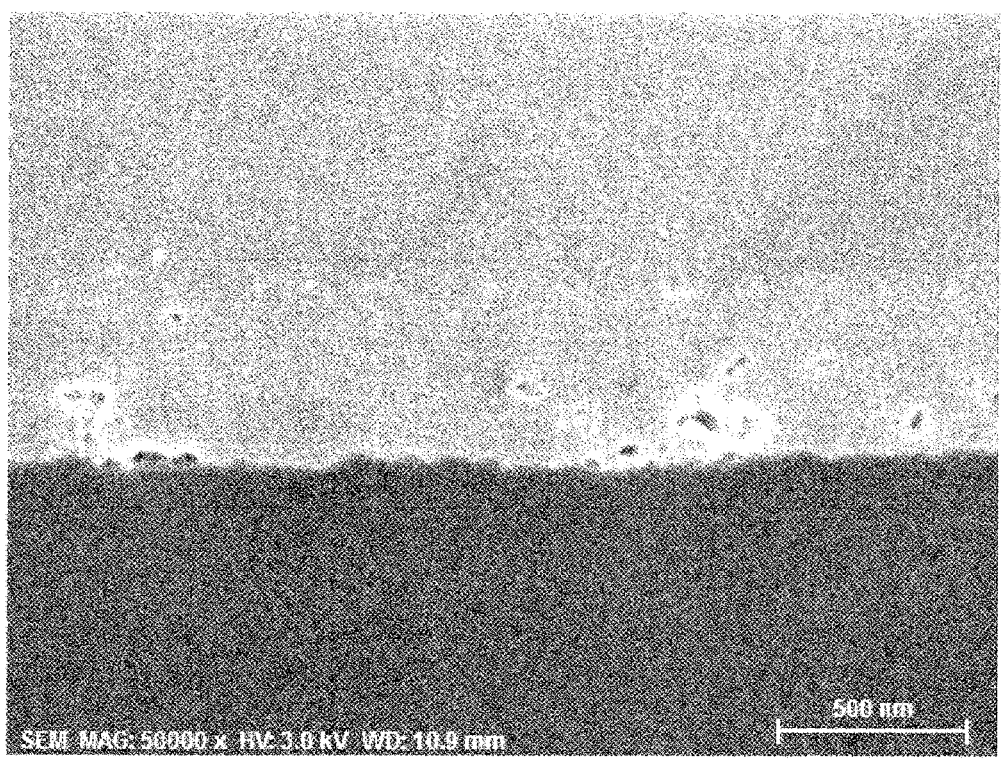
FIG. 2 is an electron micrograph of a section of a substrate for a printed circuit board according to an embodiment of the present invention.

Furthermore, a detailed description will be made of a substrate for a printed circuit board according to an embodiment of the present invention, the substrate being shown as an example in FIG. 2. The substrate for a printed circuit board includes a base film having an insulating property, and the above-described sintered body that is film-like and stacked directly on at least one of surfaces of the base film.

The substrate for a printed circuit board is used for manufacturing a printed circuit board by forming a conductive pattern using a subtractive method or a semi-additive method in which the sintered body is used.

<Base Film>

Examples of the material of the base film include flexible resins such as polyimides, liquid-crystal polymers, fluororesins, polyethylene terephthalate, and polyethylene naphthalate; rigid materials such as paper impregnated with a phenolic resin, paper impregnated with an epoxy resin, glass composites, fiberglass cloths impregnated with an epoxy resin, Teflon (registered trademark), and glass base materials; and rigid-flexible materials which are composites of a hard material and a soft material. Among these, polyimides are particularly preferred because they exhibit high bonding strength to, for example, metal oxides.

The thickness of the base film is determined in accordance with the specification of a printed circuit board produced by using the substrate for a printed circuit board, and the thickness is not particularly limited. For example, the lower limit of the average thickness of the base film is preferably 5 am, and more preferably 12 µm. The upper limit of the average thickness of the base film is preferably 2 mm, and more preferably 1.6 mm. When the average thickness of the base film is less than the lower limit, the base film may have insufficient strength. On the other hand, when the average thickness of the base film is more than the upper limit, a reduction in the thickness of the printed circuit board may become difficult to achieve.

In the base film, the surface to which an ink is to be applied is preferably subjected to a hydrophilic treatment. Examples of the hydrophilic treatment include a plasma treatment for making a surface hydrophilic by irradiation with plasma and an alkali treatment for making a surface hydrophilic with an alkali solution. When the base film is subjected to such a hydrophilic treatment, the ink exhibits a reduced surface tension to the base film, and thus the ink is easily uniformly applied to the base film.

<Sintered Body>

The sintered body is stacked on one of surfaces of the base film by application and firing of an ink containing a metal powder according to an embodiment of the present invention, as described above. In the substrate for a printed circuit board, the sintered body is formed by application and sintering of the ink. Therefore, one of the surfaces of the base film can be easily covered with a flexible, conductive film.

The lower limit of the average thickness of the sintered body is preferably 0.05 µm, and more preferably 0.1 µm. The upper limit of the average thickness of the sintered body is preferably 2 µm, and more preferably 1.5 µm. When the average thickness of the sintered body is less than the lower limit, a portion where a metal powder is not present is increased in the thickness direction, which may result in a decrease in the conductivity. On the other hand, when the average thickness of the sintered body is more than the upper limit, a reduction in the thickness of a conductive layer may become difficult to achieve.

In the substrate for a printed circuit board, the sintered body may be subjected to electroplating or electroless plating. By conducting such plating, gaps of the sintered body are filled with a metal to densify the sintered body, and a metal layer is further stacked on a surface of the sintered body to increase the thickness of a conductor layer.

[Method for Manufacturing Substrate for Printed Circuit Board]

Figure 3:
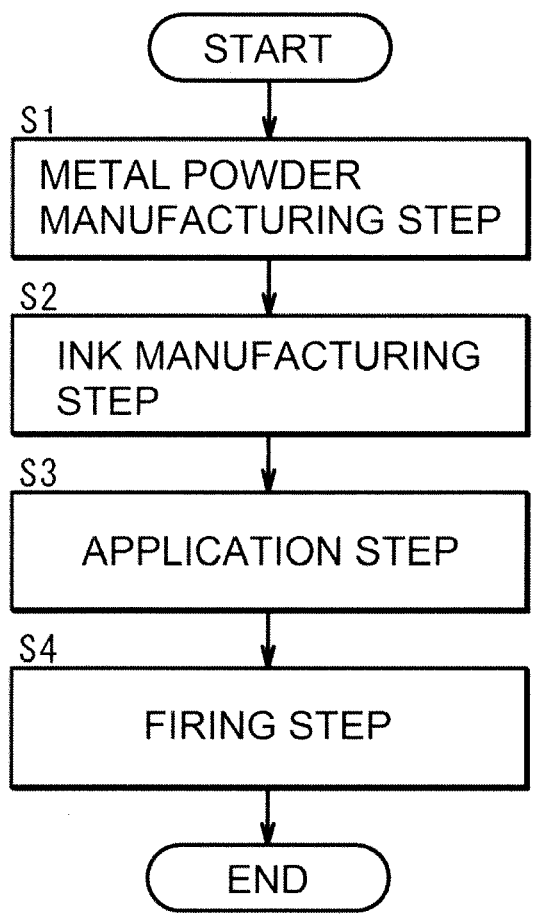
FIG. 3 is a flowchart illustrating a procedure of manufacturing a substrate for a printed circuit board according to an embodiment of the present invention.

As shown in FIG. 3, the substrate for a printed circuit board can be manufactured by a method including a step of manufacturing the metal powder (step S1: metal powder manufacturing step), a step of manufacturing the ink by using the metal powder obtained in the metal powder manufacturing step (step S2: ink manufacturing step), a step of applying the ink obtained in the ink manufacturing step (step S3: application step), and a step of firing a coating film of the ink applied in the application step (step S4: firing step).

<Metal Powder Manufacturing Step>

In the metal powder manufacturing step of step S1, as described above, a metal powder having the above mean particle size $D_{50BET}$, the above mean crystallite size $D_{Cryst}$, and the above ratio of the mean crystallite size $D_{Cryst}$ to the mean particle size $D_{50BET}$ is manufactured by preferably using a liquid-phase reduction method, more preferably using a titanium redox process in which a trivalent titanium ion is used as a reducing agent.

<Ink Manufacturing Step>

In the ink manufacturing step of step S2, as described above, the metal powder is dispersed in a dispersion medium to manufacture an ink.

<Application Step>

In the application step of step S3, as described above, the ink is applied to at least one of surfaces of a base film.

Examples of the method for applying the ink include conventionally known coating methods such as spin coating, spray coating, bar coating, die coating, slit coating, roll coating, and dip coating. Alternatively, the ink may be applied to only a portion of one of the surfaces of the base film by, for example, screen printing or using a dispenser.

<Firing Step>

In the firing step of step S4, as described above, the coating film of the ink formed on the base film is fired to volatilize and decompose the dispersion medium, a dispersing agent, and other organic substances and to bond the residual metal particles to each other, thus forming a sintered body.

[Advantages]

Since the substrate for a printed circuit board includes the sintered body that is film-like and stacked on at least one side of a base film, it is possible to manufacture a printed circuit board in which the sintered body is unlikely to be broken by bending and which exhibits good flexibility.

Other Embodiments

It is to be understood that the embodiments disclosed herein are only illustrative and are not restrictive in all respects. The scope of the present invention is not limited to the configurations of the embodiments and is defined by the claims described below. The scope of the present invention is intended to cover all the modifications within the meaning and scope of equivalents of the claims.

For example, a layer such as a primer layer may be disposed between the base film and the sintered body.

EXAMPLES

Hereinafter, the present invention will be described in detail with reference to Examples. The description of Examples does not limit the interpretation of the present invention.

Copper ions were reduced by the liquid-phase reduction method of the embodiment described above to generate three types of metal powders. Inks were prepared by using the metal powders separated from aqueous solutions. The inks were applied to polyimide substrates, and the substrates were fired to prepare three types of substrates for printed circuit boards.

<Metal Powder No. 1>

In a beaker, 80 g of a titanium trichloride solution serving as a reducing agent, 50 g of sodium carbonate serving as a pH adjuster, 90 g of sodium citrate serving as a complexing agent, and 1 g of polyvinylpyrrolidone (molecular weight: 30,000) serving as a dispersing agent were dissolved in 1 L of pure water, and the temperature of the resulting aqueous solution was held at 35° C. An aqueous solution of 10 g of copper sulfate, whose temperature was held at the same temperature, was added to the aqueous solution under stirring to precipitate copper particles. To the copper particles separated by centrifugal separation at 10,000 rpm, 100 mL (10% by mass relative to the amount of the aqueous solution for liquid-phase reduction) of pure water was added, and a dispersion treatment in which ultrasonic vibrations were applied while stirring with a stirrer at 400 rpm was performed for 10 minutes. This step was repeated twice to prepare a metal powder No. 1 containing copper as a main component.

<Metal Powder No. 2>

Copper particles were precipitated under the same conditions as those of the metal powder No. 1 except that the holding temperature of the aqueous solution was changed to 60° C., and the precipitated copper particles were similarly washed. As a result, an aqueous dispersion of a metal powder No. 2 was prepared.

<Metal Powder No. 3>

Copper particles were precipitated under the same conditions as those of the metal powder No. 1 except that ethylene glycol was used as a reducing agent, and the holding temperature of the aqueous solution was changed to 200° C., and the precipitated copper particles were similarly washed. As a result, an aqueous dispersion of a metal powder No. 3 was prepared.

<Mean Particle Size Determined by SEM Observation>

Regarding each of the metal powder Nos. 1 to 3, a mean particle size $D_{SEM}$ (volume-based value) was measured on an image taken by scanning electron microscopy.

According to the specific measurement results, the metal powder No. 1 had a mean particle size $D_{SEM}$ of 120 nm, the metal powder No. 2 had a mean particle size $D_{SEM}$ of 50 nm, and the metal powder No. 3 had a mean particle size $D_{SEM}$ of 50 nm.

<Mean Crystallite Size>

Regarding each of the metal powder Nos. 1 to 3, a mean crystallite size $D_{Cryst}$ was measured by X-ray diffraction from a (1, 1, 1) plane. In the measurement of the mean crystallite size $D_{Cryst}$, an "X'PERT PRO" available from Royal Philips was used.

According to the specific measurement results, the metal powder No. 1 had a mean crystallite size $D_{Cryst}$ of 18 nm, the metal powder No. 2 had a mean crystallite size $D_{Cryst}$ of 8 nm, and the metal powder No. 3 had a mean crystallite size $D_{Cryst}$ of 15 nm.

<Mean Particle Size Determined by BET Method>

Regarding each of the metal powder Nos. 1 to 3, a specific surface area was measured by the BET method, and a mean particle size $D_{50BET}$ was calculated from the measured specific surface area. In the measurement of the specific surface area, an "ASAP 2010" available from Micrometrics Instrument Corp. was used, and nitrogen gas was used as a measurement gas.

According to the specific measurement results, the metal powder No. 1 had a mean particle size $D_{50BET}$ of 85 nm, the metal powder No. 2 had a mean particle size $D_{50BET}$ of 30 nm, and the metal powder No. 3 had a mean particle size $D_{50BET}$ of 30 nm.

<Metal Composition>

Regarding each of the metal powder Nos. 1 to 3, a metal composition was measured by ICP analysis (inductively coupled plasma-atomic emission spectroscopy). In the ICP analysis, an "iCAP 6300 DUO" available from Thermo Fisher Scientific Inc. was used.

According to the specific measurement results, the metal powder No. 1 and the metal powder No. 3 contained copper as a main metal and 0.1% by mass of titanium as an auxiliary metal. On the other hand, the metal powder No. 2 contained copper as a main metal but did not contain an auxiliary metal other than copper (the content was less than the detection limit).

<Sintered Body Nos. 1 to 3>

Three types of inks each of which contained water as a solvent and had a copper concentration of 25% by mass were prepared by using the metal powder Nos. 1 to 3. The inks were each applied to a polyimide substrate serving as a base film with a bar coater and dried to form a copper particle coating film having an average thickness of 150 nm. The polyimide substrates each having the copper particle coating film thereon were fired in a nitrogen atmosphere at a temperature of 300° C. for two hours to obtain sintered body Nos. 1 to 3 stacked on the polyimide substrates.

<Mean Crystallite Size>

Regarding each of the sintered body Nos. 1 to 3, the mean crystallite size $D_{Cryst}$ was measured by X-ray diffractometry. In this measurement, the same apparatus as that used in the measurement of the mean crystallite size of the metal powder Nos. 1 to 3 was used.

According to the specific measurement results, the sintered body No. 1 had a mean crystallite size $D_{Cryst}$ of 20 nm, the sintered body No. 2 had a mean crystallite size $D_{Cryst}$ of 15 nm, and the sintered body No. 3 had a mean crystallite size $D_{Cryst}$ of 30 nm.

<Bending Test>

The printed circuit board Nos. 1 to 3 were each bonded to a polyimide substrate having an adhesive layer to prepare samples for evaluating flexibility. The samples were each repeatedly bent with a flexural endurance tester with a radius of curvature of 2 mm, at a speed of 1,500 rpm, and with a sliding distance of 20 mm to examine the number of times of bending until the conductive patterns were broken. An "SEK-31B4S" available from Shin-Etsu Engineering Co., Ltd. was used as the flexural endurance tester.

According to the specific measurement results, regarding each of the printed circuit board No. 1 and the printed circuit board No. 2, breaking did not occur at the time when bending was performed 250,000,000 times, and thus the test was finished at the time. In contrast, regarding the printed circuit board No. 3, the number of times of bending until breaking occurred was about 50,000,000.

Table 1 below shows the mean particle size $D_{SEM}$ determined by SEM observation, the mean crystallite size $D_{Cryst}$, the mean particle size $D_{50BET}$ determined by the BET method, the metal composition, and the ratio ($D_{Cryst}/D_{50BET}$) of the mean crystallite size $D_{Cryst}$ to the mean particle size $D_{50BET}$ determined by the BET method of the metal powder Nos. 1 to 3, the mean crystallite size $D_{Cryst}$ of the sintered body Nos. 1 to 3, and the number of times of bending until breaking occurred in the bending test of the printed circuit board Nos. 1 to 3.

TABLE 1

| | | No. 1 | No. 2 | No. 3 |
|---|---|---|---|---|
| Metal powder | Reducing agent | Trivalent titanium ion | Trivalent titanium ion | Ethylene glycol |
| | Reduction temperature | 35° C. | 60° C. | 200° C. |
| | Mean particle size determined by SEM observation ($D_{SEM}$) | 120 nm | 50 nm | 50 nm |
| | Mean crystallite size ($D_{Cryst}$) | 18 nm | 8 nm | 15 nm |
| | Mean particle size determined by BET method ($D_{50\ BET}$) | 85 nm | 30 nm | 30 nm |
| | $D_{Cryst}/D_{50\ BET}$ | 0.21 | 0.27 | 0.50 |
| | Metal composition | Copper + 0.1 wt % Titanium | Copper + 0.1 wt % Titanium | Copper |
| Sintered body | Mean crystallite size ($D_{Cryst}$) | 20 nm | 15 nm | 30 nm |
| Printed circuit board | Film thickness (after electroless plating) | 1 μm | 1 μm | 1 μm |
| | Film thickness (after electroplating) | 10 μm | 10 μm | 10 μm |
| | Number of times of bending until breaking occurred | 250,000,000 times or more | 250,000,000 times or more | 50,000,000 times |

<Printed Circuit Board Nos. 1 to 3>

The surfaces of the sintered bodies of the sintered body Nos. 1 to 3 were each subjected to electroless copper plating, so that the total average thickness of the sintered body and the resulting electroless plating layer became 1 μm, and further subjected to copper electroplating. As a result, three types of substrates for printed circuit boards were obtained in which a metal layer having an average thickness of 10 μm and including the sintered body, the electroless plating layer, and the resulting electroplating layer was stacked on the base film. Furthermore, printed circuit board Nos. 1 to 3 were formed by a subtractive method using the substrates for printed circuit boards. More specifically, a resist film was formed on each of the substrates for printed circuit boards, etching was performed, and the resist film was then removed to form a pattern of the metal layer. As a result, the printed circuit board Nos. 1 to 3 having conductive patterns formed as described above were obtained.

The results of the bending test indicated that the printed circuit board Nos. 1 and 2 had good flexibility and good fatigue strength, and the printed circuit board No. 3 had low fatigue strength.

Referring to Table 1, a factor considered to have a correlation with the results of the bending test is the mean crystallite size $D_{Cryst}$ of a sintered body. Specifically, a small mean crystallite size $D_{Cryst}$ of a sintered body probably provides good flexibility and fatigue strength of the conductive pattern formed by using the sintered body as a base.

Factors that decrease the mean crystallite size $D_{Cryst}$ of a sintered body are probably the temperature during reduction of a metal powder, the ratio of the mean crystallite size $D_{Cryst}$ to the mean particle size $D_{50BET}$ determined by the BET method, and the metal composition. It is believed that, in particular, when the ratio ($D_{Cryst}/D_{50BET}$) of the mean crystallite size $D_{Cryst}$ to the mean particle size $D_{50BET}$ of a metal powder determined by the BET method is less than a particular upper limit, the mean crystallite size $D_{Cryst}$ during sintering can be decreased, and flexibility and fatigue strength of the sintered body can be improved. A lower temperature during reduction probably suppresses the growth of crystallites. A trace amount of an auxiliary metal contained in a metal powder also probably suppresses the growth of crystallites.

INDUSTRIAL APPLICABILITY

The present invention is suitably used for forming a flexible, conductive pattern that is repeatedly bent and stretched.

REFERENCE SIGNS LIST

S1 metal powder manufacturing step
S2 ink manufacturing step
S3 application step
S4 firing step

The invention claimed is:

1. A metal powder having a mean particle size $D_{50BET}$ of 1 nm or more and 200 nm or less as calculated by a BET method, a mean crystallite size $D_{Cryst}$ of 20 nm or less as determined by an X-ray analysis,
a ratio ($D_{Cryst}/D_{50BET}$) of the mean crystallite size $D_{Cryst}$ to the mean particle size $D_{50BET}$ of less than 0.4, and
the metal powder comprising copper or a copper alloy as a main component.

2. The metal powder according to claim 1, comprising a metal different from the main component.

3. The metal powder according to claim 1, wherein the metal powder is formed by a liquid-phase reduction method of reducing a metal ion with a reducing agent in an aqueous solution.

4. The metal powder according to claim 3, wherein the reducing agent used in the liquid-phase reduction method is a trivalent titanium ion.

5. The metal powder according to claim 2, wherein the metal different from the main component is at least one metal selected from the group consisting of titanium, silver, nickel, and zinc.

6. The metal powder according to claim 5, wherein a content of the metal different from the main component relative to the main metal in the metal powder is in a range of 0.02% by mass to 5% by mass.

* * * * *